United States Patent [19]
Tsutsui

[11] Patent Number: 5,754,501
[45] Date of Patent: May 19, 1998

[54] INFORMATION TRANSMISSION METHOD AND APPARATUS AND INFORMATION RECEIVING METHOD AND APPARATUS

[75] Inventor: Kyoya Tsutsui, Kanagawa, Japan

[73] Assignee: Sony Corporation, Tokyo, Japan

[21] Appl. No.: 618,130

[22] Filed: Mar. 19, 1996

[30] Foreign Application Priority Data

Mar. 30, 1995 [JP] Japan .................... 7-073708

[51] Int. Cl.⁶ .................... G11B 17/22
[52] U.S. Cl. .................... 369/32; 369/60
[58] Field of Search .................... 369/47, 48, 57, 369/58, 60, 32, 30, 124, 29, 84, 85, 14, 15, 7

[56] References Cited

U.S. PATENT DOCUMENTS 5,133,081  7/1992  Mayo .................... 369/7
5,408,686  4/1995  Mankovitz .................... 369/47 X
5,517,477  5/1996  Sako .................... 369/60

Primary Examiner—Paul W. Huber
Attorney, Agent, or Firm—Limbach & Limbach L.L.P.

[57] ABSTRACT

Methods and apparatus for transmitting and receiving the information for smooth distribution of the information, such as the news or music, to a number of recipients with sufficient quality. The information to be transmitted, that is the transmission information, is repetitively transmitted at a rate higher than the rate of information reproduction at a receiver. The transmission to be received, that is the reception information, can be recorded in a shorter time by the receiver. Also, the information repetitively transmitted at a rate higher than the rate of information reproduction is received and the reception information is recorded from the repeatedly transmitted received information, so that the required information can be received in a shorter time.

12 Claims, 16 Drawing Sheets

INFORMATION TRANSMISSION METHOD AND APPARATUS AND INFORMATION RECEIVING METHOD AND APPARATUS

BACKGROUND OF THE INVENTION

1. Field of the Invention

This invention relates to a method and apparatus for transmitting and receiving the information for smooth distribution of the information, such as the news or music, to a number of recipients, with sufficient quality.

2. Description of the Related Art

Among the media for distributing the information, such as news or music, there are broadcasting media, such as radio broadcasting and television broadcasting. Much of the equipment used for receiving radio or television broadcasts are portable. Therefore, if this portable equipment is used, it is possible for the user of the equipment to acquire the information, such as news or music, on various receiving sites.

If electrical waves for radio or television broadcasting are used, the speech or pictures may be sent simultaneously to a number of recipients. However, if these recipients are moving, the information receiving state becomes unstable from one receiving site to another. Consequently, sufficient sound or picture quality cannot be assured.

For overcome such inconvenience, for communication with recipients in a basement store or in an electric rolling stock, a method is used which consists of re-transmitting signals once received on the ground or outside the rolling stock to the basement store or to within the rolling stock.

However, the re-transmission equipment is provided in only limited areas, such that, if the recipient using the receiving equipment of the re-transmitted information is not at a site within a range covered by the re-transmission equipment, signals of sufficient quality cannot be received. In addition, each recipient is able to view or hear only the program which is currently on air.

SUMMARY OF THE INVENTION

It is therefore an object of the present invention to provide a method and apparatus for transmitting and receiving information whereby the information, such as speech or pictures, can be offered promptly to a number of recipients, and whereby high-quality speech or pictures can be furnished freely and repeatedly when desired by a recipient even if the recipient is moving.

In one aspect, the present invention provides a method for transmitting information to a receiver including the steps of storing the information on a recording medium, repeatedly reading out the transmission information from the information stored on the recording medium at a rate higher than a rate of reproduction at the receiver and repeatedly transmitting the repeatedly read-out transmission information at a rate higher than the rate of reproduction at the receiver.

In another aspect, the present invention provides an apparatus for transmitting information to a receiver including a recording medium in which the information is stored, control means for storing the information on the recording medium and for repeatedly reading out the transmission information from the information stored in the recording medium at a rate higher than a rate of reproduction by the receiver and means for repeatedly transmitting the repeatedly read-out transmission information at a rate higher than the rate of reproduction by the receiver.

According to the present invention, since the information to be transmitted, that is the transmission information, is repetitively transmitted at a rate higher than the rate of information reproduction at a receiver, the transmission to be received, that is the reception information, can be recorded in a shorter time by the receiver.

Also, according to the present invention, since the information repetitively transmitted at a rate higher than the rate of information reproduction is received and the reception information is recorded from the repeatedly transmitted received information, the required information can be received in a shorter time. The required information may be produced a number of times by reproducing the recorded information.

DETAILED DESCRIPTION OF PREFERRED EMBODIMENTS

Figure 1:
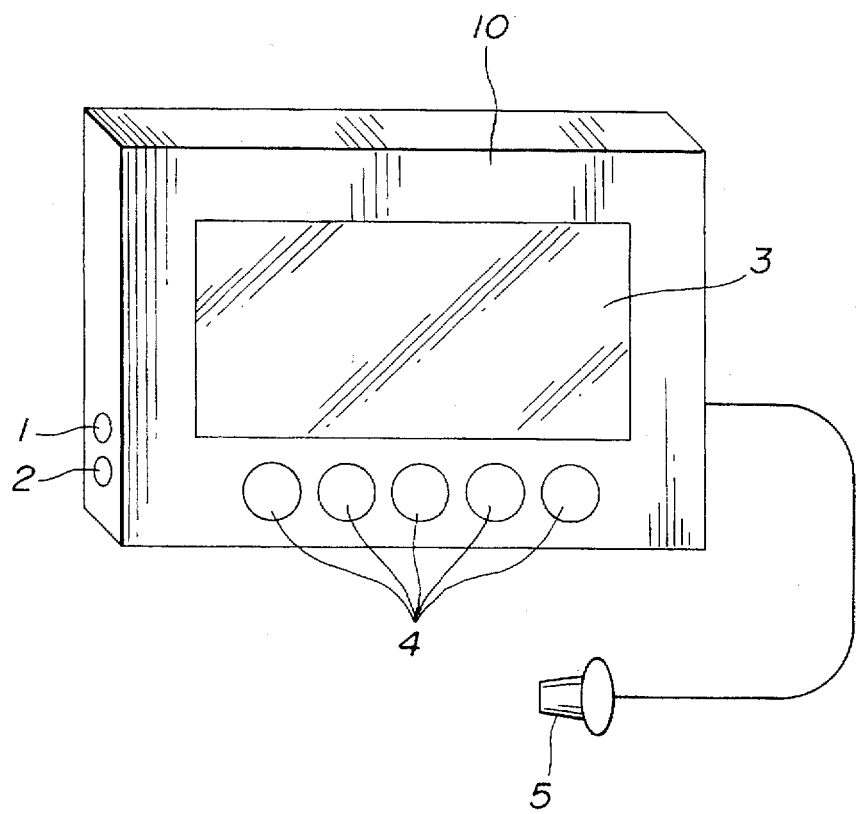
FIG. 1 is a perspective view showing an information recording/reproducing apparatus according to a first embodiment.

Referring to the drawings, preferred embodiments of the present invention will be explained in detail.

FIG. 1 shows, in a perspective view, an information recording/reproducing apparatus 10 of a first embodiment for recording/reproducing the information supplied from an information furnishing/collecting apparatus as an information transmission apparatus implementing the information transmission method according to the present invention.

The information recording/reproducing apparatus 10 of the present first embodiment has a connection terminal 1 (terminal for connection to the information furnishing/collecting terminal) and another connection terminal 2 (terminal for connection to the information furnishing/collecting terminal). The connection terminal 1 is designed for receiving the information furnished from the information furnishing/collecting apparatus on connection to the information furnishing/collecting apparatus. The connection terminal 2 is designed for transmitting the information reproduced from the recording medium provided within the information recording/reproducing apparatus 10 to the information furnishing/collecting apparatus. The information furnished from the information furnishing/collecting apparatus via the connection terminal 1 is recorded on the recording medium provided within the information recording/reproducing apparatus 10, while the information transferred from the information recording/reproducing apparatus 10 via the connection terminal 2 is collected by the information furnishing/collecting apparatus. In the embodiment of FIG. 1, the connection terminals 1 and 2 are provided for information reception and information transmission, respectively. However, the connection terminals 1 and 2 may be combined into one connection terminal which is then switched from information reception to information transmission or vice versa.

In addition to the connection terminals 1 and 2, a display 3 for information display and a series of playback selection buttons 4 for selecting the information to be reproduced, are provided on the information recording/reproducing apparatus 10. The contents of the information recorded on the recording medium provided within the information recording/reproducing apparatus 10 may be displayed on the display 3. By pressing the reproduction selection buttons 4, the user is able to selectively reproduce the necessary information data from the recording contents displayed on the display 3 or enter other selection information. Contents of the reproduced information include, e.g., text information, speech information, picture information or computer program information. Speech information is meant to comprise acoustic information as well. If playback information is text information or picture information, the text corresponding to the text information or the picture corresponding to the picture information may be displayed on the display 3. If the playback information is speech information, speech waveform signals corresponding to picture information may be output at a speech radiation portion, such as an earphone 5. Instead of or in addition to the earphone 5, a speaker or the like may be used as the speech radiating portion, although this is not shown in FIG.2. In this case, the speech waveform signal corresponding to the speech information may be output at the speaker. The above-mentioned reproduction of the program information means execution of a computer program. As a display 3, a flat panel display, such as a liquid crystal display, a plasma display or a field emission display may be employed.

The playback information may be transmitted to a speaker or a cathode ray tube (CRT) display connected via an external terminal, such as a video output terminal or a speech output terminal, provided on the information recording/reproducing apparatus 10, although this is not shown in FIG. 1. Although there is no limitation in the first embodiment of the present invention as to the type of recording medium provided within the information recording/reproducing apparatus 10, it is convenient to employ a readily portable so-called IC memory which permits high-speed duplication and random accessing.

Figure 2:
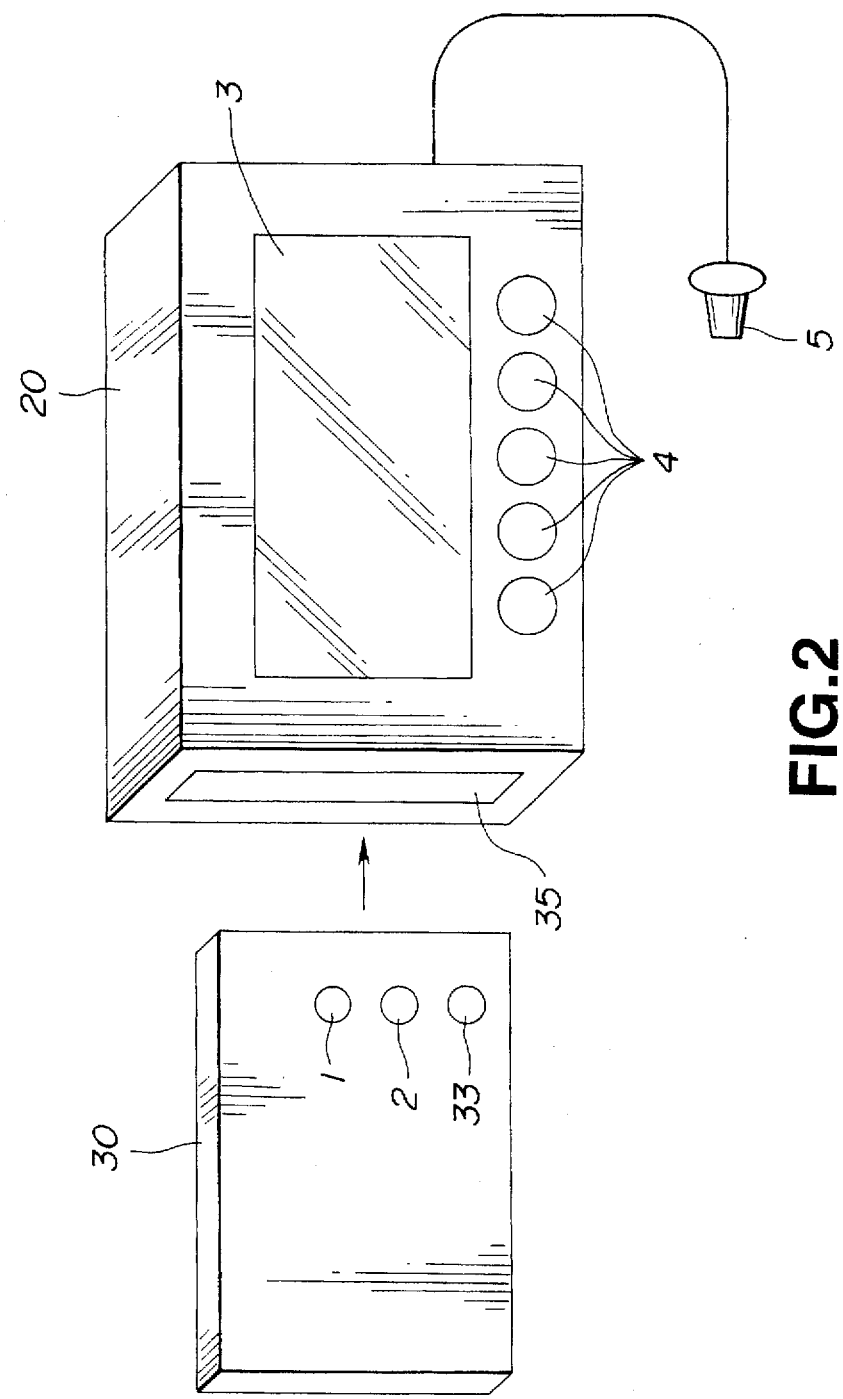
FIG. 2 is a perspective view showing an information recording apparatus and an information reproducing apparatus according to a second embodiment.

FIG. 2 shows, in perspective, an information recording/reproducing apparatus 20 and an information recording apparatus 30, according to the second embodiment, for recording or reproducing the information furnished by the information furnishing/collecting apparatus which is an information transmission apparatus for implementing the information transmission method of the present invention. In the embodiment of FIG.2, the function of the information recording/reproducing apparatus 10 of FIG. 1 is physically divided into an information reproducing apparatus 20 and an information recording apparatus 30. Thus the information reproducing apparatus 20 is provided with a display unit 3 and a series of playback selection buttons 4 similar to those shown in FIG. 1. An earphone 5 may also be mounted, if so desired. The information recording apparatus 30 is provided with connection terminals 1 and 2 for coupling to the information furnishing/collecting apparatus. However, since data and control signals need to be transmitted and received during reproduction between the information recording apparatus 30 and the information reproducing apparatus 20, the apparatus 20, 30 are provided with dedicated connection terminals. In FIG.2, only the connection terminal (information reproducing apparatus connecting terminal) 33 on the information reproducing apparatus 20 functioning as the terminal interconnecting the apparatus 20 and 30 is shown. The connection terminals 1 and 2, provided on the information recording apparatus 30, may be combined into one connection terminal, as in the first embodiment described above. In such case, the sole connection terminal is switched from reception to transmission or vice versa. In the embodiment of FIG. 2, the information from the information recording apparatus 30 may be transmitted to the information reproducing apparatus 20 by connecting the information reproducing apparatus 20 to an inlet/outlet opening 35 of the information recording apparatus 30. Although there is no particular limitation as to the type of the recording medium provided in the information recording apparatus 30, it may conveniently be a readily portable so-called IC memory which permits random accessing and high-speed duplication.

Figure 3:
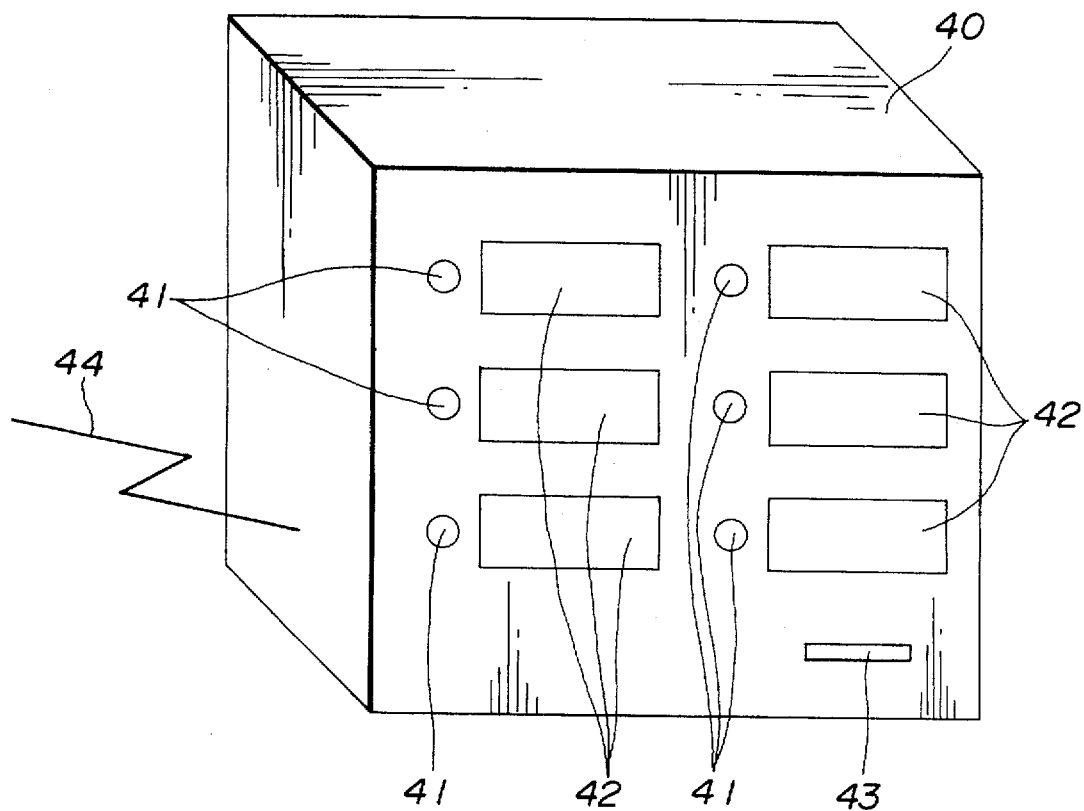
FIG. 3 is a perspective view showing an illustrative example of an information furnishing/collecting apparatus.

FIG. 3 shows, in perspective, an embodiment of an information furnishing/collecting apparatus 40.

The information furnishing/collecting apparatus 40 has enclosed therein a recording medium on which is recorded information. To the information furnishing/collecting apparatus 40 is connected a cable functioning as an information transmission unit 44. Thus the information from other apparatuses may be transmitted by the information transmission unit 44 to the information furnishing/collecting apparatus 40 or the information may be transmitted from the information furnishing/collecting apparatus 40 to other apparatuses. Not only the cable but also radio transmission may be employed as the information transmission unit 44. Additionally, by employing a recording medium, and by inserting the recording medium, having the information pre-recorded thereon, into the information furnishing/collecting apparatus 40, the information of the recording medium may be furnished to the information furnishing/collecting apparatus 40. The recording medium within the information furnishing/collecting apparatus 40 may be dismounted and inserted into anther apparatus for supplying the information of the recording medium to the other apparatus. Alternatively, another recording medium may be inserted into the information furnishing/collecting apparatus 40 and may be taken out therefrom after duplicating the information thereon. Although there is no particular limitation to the type of the recording medium provided within the information furnishing/collecting apparatus 40, it may conveniently be a readily portable so-called IC memory which permits random accessing and high-speed duplication.

The information furnishing/collecting apparatus 40 is provided with plural display portions 42 for displaying the contents of the information recorded on the recording medium and plural output selection buttons 41 for selecting which of the information data displayed on the display portion 42 is to be outputted from the information furnishing/collecting apparatus 40. Thus a user desirous to acquire the information via cable may select special desired information data from among the information data displayed on the display 42 using the output selection button 41. As the display 42, a flat panel display, such as a liquid crystal display, a plasma display or a field emission display may be employed.

In addition, the user desirous to acquire the information thus selected inserts his or her information recording/reproducing apparatus 10 or information recording apparatus 30 of FIG.2 into an inlet/outlet opening 43 of the information furnishing/collecting apparatus 40 in order to accept a copy of the selected information thereat. It is possible for the information furnishing/collecting apparatus 40 to collect information from the information recording/reproducing apparatus 10 or from the information recording apparatus 30 during the time the information recording/reproducing apparatus 10 or the information recording apparatus 30 inserted into the inlet/outlet opening 43 is kept therein.

Figure 4:
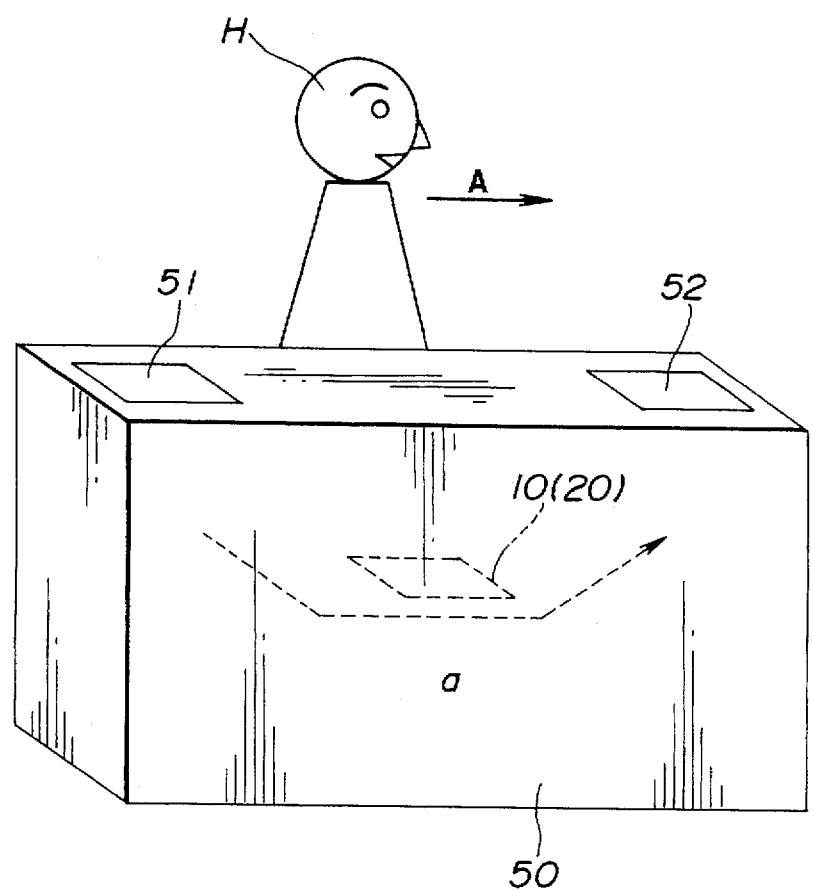
FIG. 4 is a perspective view showing another illustrative example of an information furnishing/collecting apparatus.

FIG. 4 shows, in perspective, another illustrative construction of an information furnishing/collecting apparatus 50.

In the illustrative construction, shown in FIG.4, an inlet opening 51 and an outlet opening 52 are split and arrayed at a distance from each other. A user desirous to acquire the information H is able to acquire the information from the information furnishing/collecting apparatus 50 or transmit the information thereto as he or she walks in a direction indicated in FIG. 4. In this case, the information recording/reproducing apparatus 10 or information recording apparatus 30 inserted via the inlet opening 51 is transported by a mobile portion comprised of a conveyor belt in the information furnishing/collecting apparatus 50 and a driving device therefor in a direction indicated by arrow a within the apparatus 50. During this time interval, the information is copied from the information furnishing/collecting apparatus 50 to the information recording/reproducing apparatus 10 or information recording apparatus 30 or the information from the information recording/reproducing apparatus 10 or information recording apparatus 30 is collected by the information furnishing/collecting apparatus 50. Subsequently, the information recording/reproducing apparatus 10 or information recording apparatus 30 is taken out at the outlet opening 52. The present apparatus 50 enables the information to be furnished to a large number of recipients, while enabling the information to be quickly collected from a large number of recipients.

By employing the information recording/reproducing apparatus 10 or information recording apparatus 30 and the information furnishing/collecting apparatus 40 or 50, the information desired by the recipients may be quickly furnished or the information can be quickly collected from the recipients.

Figure 5:
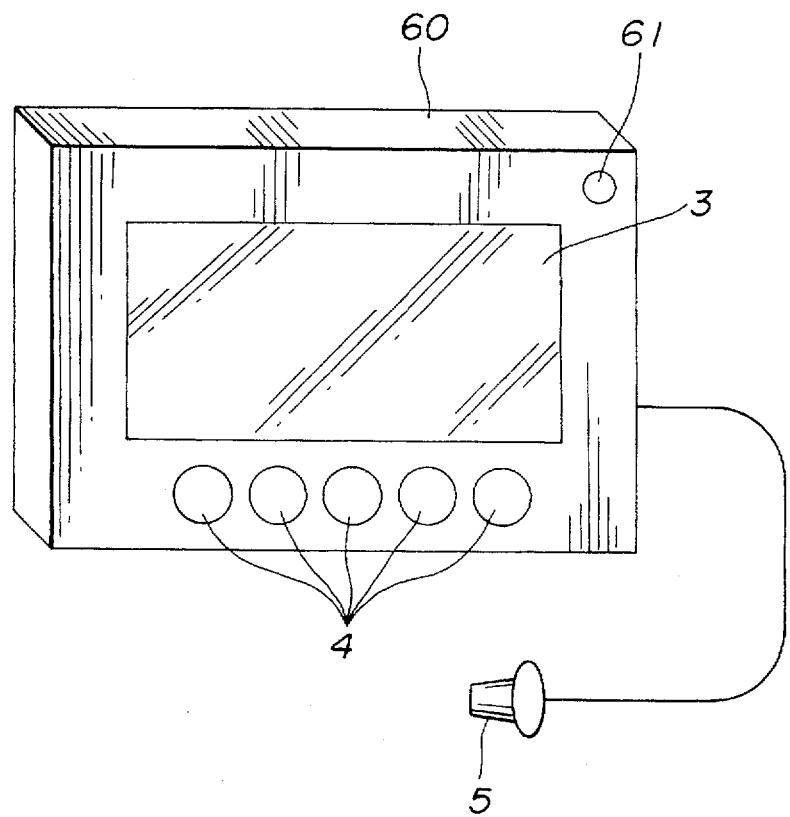
FIG. 5 is a perspective view showing an information receiving, recording and reproducing apparatus according to a third embodiment.

FIG. 5 shows, in perspective, an information receiving/recording/reproducing apparatus 60 as a third embodiment of the present invention.

The information receiving/recording/reproducing apparatus 60, shown in FIG. 5, has a display 3 and a series of playback selection buttons 4 similar to those of the information recording/reproducing apparatus 10 shown in FIG. 1. However, the information receiving/recording/reproducing apparatus 60 receives the information from outside, that is from an information furnishing/collecting apparatus, by an infrared receiver 61 formed by, for example, an IR receiving photodiode, instead of by the connection terminal 1 shown in FIG. 1. The connection terminals 1, 2 for connection with an information furnishing/collecting apparatus, not shown in FIG. 5, may, of course, be provided in the embodiment of FIG. 5.

Figure 6:
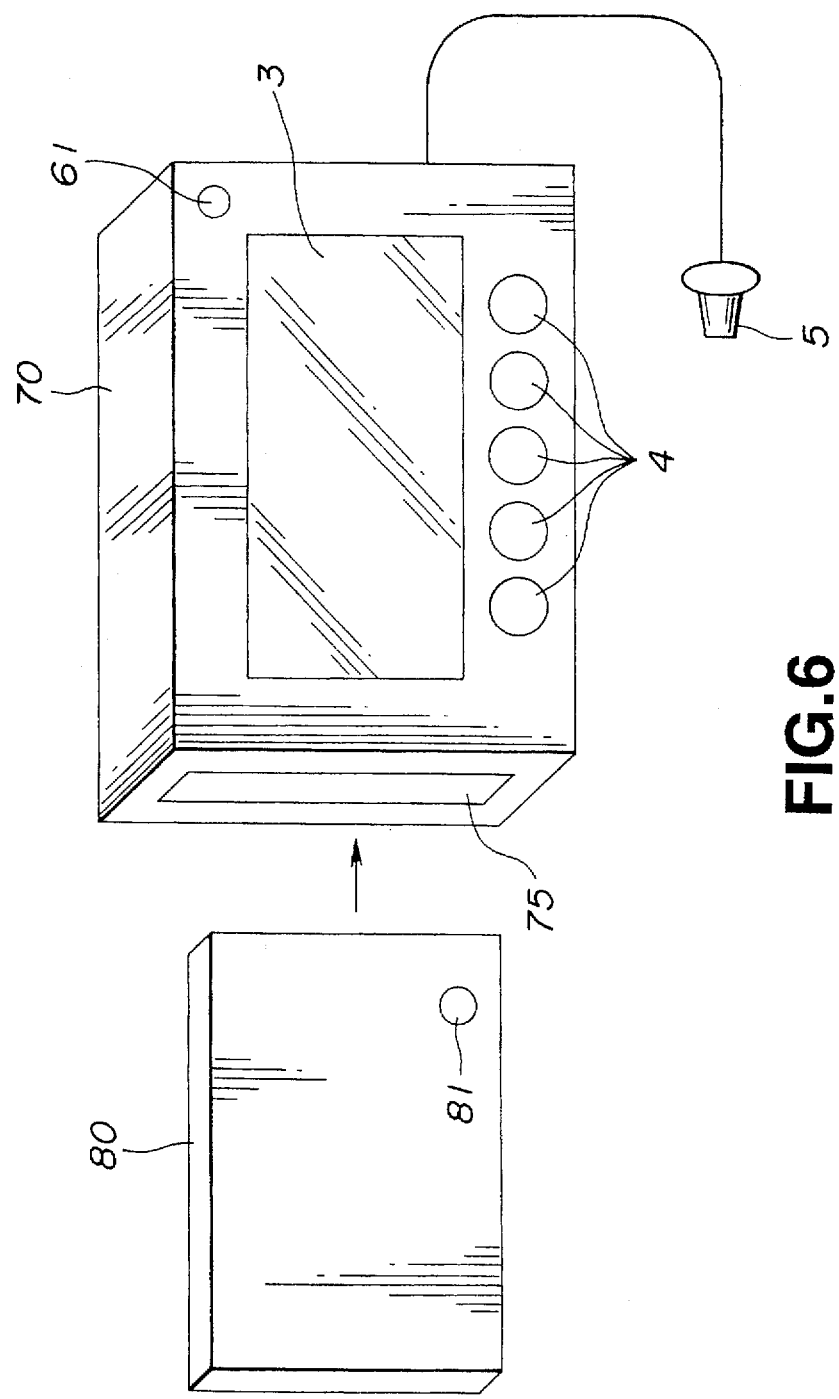
FIG. 6 is a perspective view showing an information receiving/reproducing apparatus and an information recording apparatus according to a fourth embodiment.

FIG. 6 shows a fourth embodiment in which the function of the information receiving/recording/reproducing apparatus 60 is physically separated into an information receiving/reproducing apparatus 70 and an information recording apparatus 80, as in the second embodiment described above.

Thus, in the embodiment of FIG. 6, the information receiving/reproducing apparatus 70 has a display 5 and a series of playback selection buttons 4, similar to those of FIG. 5. The information receiving/reproducing apparatus 70 also has an infrared receiver 61 and may optionally be fitted with an earphone 5. A connection terminal is provided for exchanging the information between the information receiving/reproducing apparatus 70 and the information recording apparatus 80. In FIG. 6, only a connection terminal (information receiving/reproducing apparatus connection terminal) 81 provided on the information recording apparatus 80 is shown as a terminal interconnecting the information receiving/reproducing apparatus 70 and the information recording apparatus 80. In the embodiment of FIG. 6, the information received by the information receiving/reproducing apparatus 70 may be transmitted to the information recording apparatus 80, or the information recorded in the information recording apparatus 80 may be transmitted to the information receiving/reproducing apparatus 70 by inserting the information recording apparatus 80 into an inlet/output opening 75 of the information receiving/reproducing apparatus 70. The connection terminals 1, 2 for establishing electrical connection with the information furnishing/collecting apparatus may, of course, be provided, although these connection terminals are not shown in the embodiment of FIG. 6.

The information recording apparatus and the information reproducing apparatus or the information receiving/reproducing apparatus 70 need not be unified together, as in the second and fourth embodiments described above. In addition, transmission of the information may also be performed by cable connection or radio transmission instead of via the inlet/outlet opening as described above.

The arrangements of the first and second embodiments are substantially the same as those of, for example, an information furnishing/collecting apparatus disclosed by the present Assignee in JP Patent Kokai Publication Hei-6-131371. The US application corresponding to this JP Patent Publication Hei-6-131371 is pending as Ser. No. 08/131,943 filed on Oct. 8, 1993. The information furnishing/collecting apparatus, described in this JP Patent Publication Hei-6-131371, furnishes information to the recipients via an information terminal, as means for furnishing the information, such as news, in distinction from broadcasting means employed in the above-described conventional example. The apparatus described in this JP Patent Publication is an information furnishing and collecting apparatus which has an information recording medium and property right management means, as means for promptly acquiring the information, such as the news or the music, and for collecting a response by recipients, and in which the recording or reproduction of the information may be controlled by controlling the right management means. With the technique disclosed in the JP Patent Publication, information, such as the news, is rendered available to the user of the recording/reproducing apparatus via the information terminal by connecting the recording/reproducing apparatus to an information terminal provided with the information recording medium and property right management means.

However, with the above technique of connecting the information recording/reproducing apparatus or the information recording apparatus to the information terminal, as disclosed in the above JP Patent Publication, there is imposed a limitation as to the number of persons that can be furnished with the information from the information terminal at a time, such that, if a large number of persons are desirous to be furnished with the information, each person has to wait a prolonged time. Therefore, if the information is to be furnished simultaneously to a large number of persons, it becomes necessary to increase the number of the connection terminals.

Thus, with the information transmission method according to the present invention, if the information is to be transmitted from the information furnishing/collecting apparatus, the information is repeatedly transmitted from the information furnishing/collecting apparatus at a higher or faster bit rate than the rate of information reproduction at the information recording/reproducing apparatus or the information reproducing apparatus, or that at the information receiving/recording/reproducing apparatus or the information receiving/reproducing apparatus. In particular, specified portions of the information data are transmitted frequently and repeatedly. With the information recording/reproducing apparatus. (or the information receiving/recording/reproducing apparatus), or with the information recording apparatus, the information transmitted at a bit rate higher than the information reproducing speed is recorded on a recording medium at a rate higher than the rate of information reproduction for furnishing the information to a large number of users of the information recording/reproducing apparatus easily and promptly, that is without the user having to wait for prolonged time. Thus, for reproducing the information by the information recording/reproducing apparatus, the information recorded on the recording medium is reproduced responsive to instructions from the recipients for furnishing the information to a large number of users easily and promptly. In addition, with the present invention, the information is furnished and recorded on the recording medium at a bit rate higher than the rate of information reproduction, as described above, so that, if the user has moved from a site with good receiving state to a site with an inferior receiving state, that is if the user has left the site with good receiving state, the user is able to reproduce the information received and recorded on the site with good receiving state.

The arrangement and the operation for furnishing information and recording on a recording medium at a bit rate higher than the rate of information reproduction is now explained. In the following description, the information recording apparatus is unified with the information reproducing apparatus or with the information recording/reproducing apparatus, as in the first and third embodiments, for ease of explanation. However, the following description holds for the arrangements of the second and fourth embodiments as well.

Figure 7:
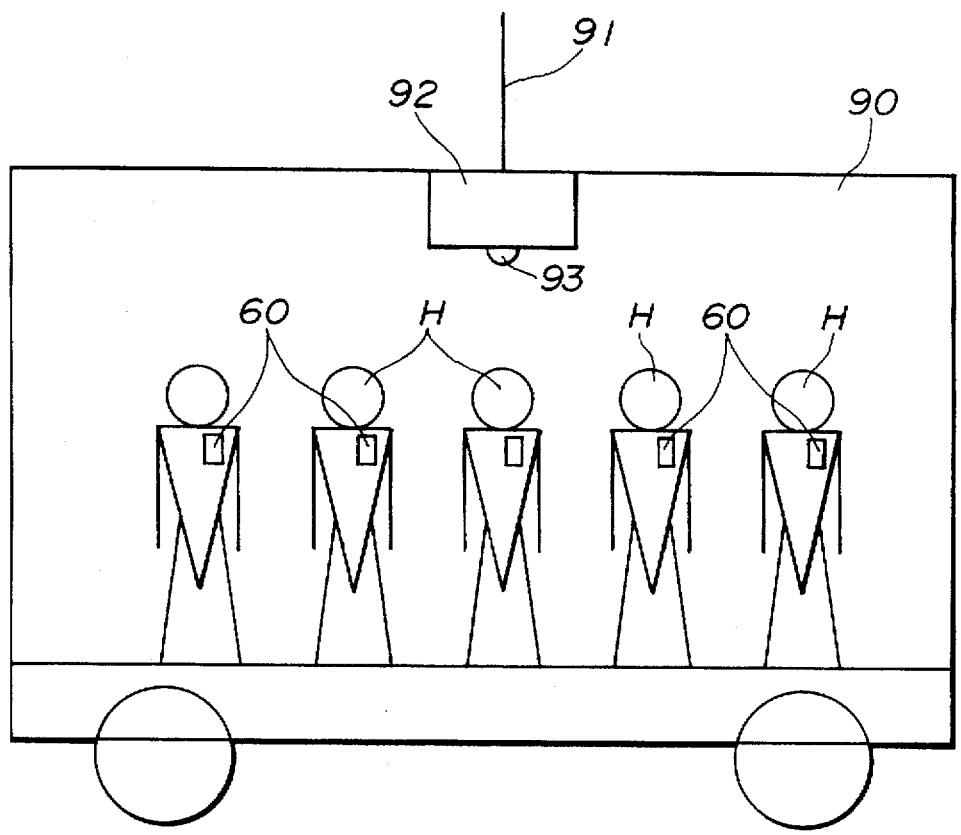
FIG. 7 illustrates an example of actual utilization of the information receiving/recording/reproducing apparatus according to the third embodiment.

Referring first to FIG. 7, an example of actually using an arrangement of the instant embodiment is shown. FIG. 7 shows plural recipients H being on board a bus 90, as an illustrative instance of the moving recipients H.

In the example shown in FIG. 7, since the receiving state for electrical waves radiated by a broadcasting medium into the inside of the bus 90 is occasionally inferior as described above, an antenna 91 for receiving the electric waves for broadcasting is installed on, for example, a roof top of the bus 90. An information sending unit 92 for re-transmitting the signals received by the antenna 91 into the inside of the bus 90 is installed on the ceiling portion. The information sending unit 92 is provided with an infrared sender 93 formed by, for example, an infrared light emitting diode, so that the signal received by the antenna 91 can be re-transmitted by the infrared sender 93. Furthermore, each recipient on board the bus 90 has the information receiving/recording/reproducing apparatus 60 provided with the infrared receiver 61 as explained in connection with the third embodiment. Each recipient receives the signal sent from the infrared sender 93 of the information sending unit 92, that is the re-transmitted signal, for receiving the information. That is, the information receiving/recording/reproducing apparatus 60 owned by each recipient H records the re-transmitted information responsive to the instructions by the recipient and reproduces the recorded information simultaneously with or after the recording of the re-transmitted information.

The bit rate of information transmission from the information sending unit 92 is set so as to be higher than the bit rate for reproduction, that is the bit rate of reproduction of the recorded information at a normal broadcasting rate. The recording of the information occurs at a similarly elevated rate. Thus it is not required for each recipient to remain in the transmission range of the information sending unit 92 until complete termination of reproduction. In particular, if the information, such as speech signals, is compressed in advance, the information transfer time may be shorter for the same transfer bit rate, thereby effectively shortening the time within which the recipient is to remain in the same transmission range.

Figure 8:
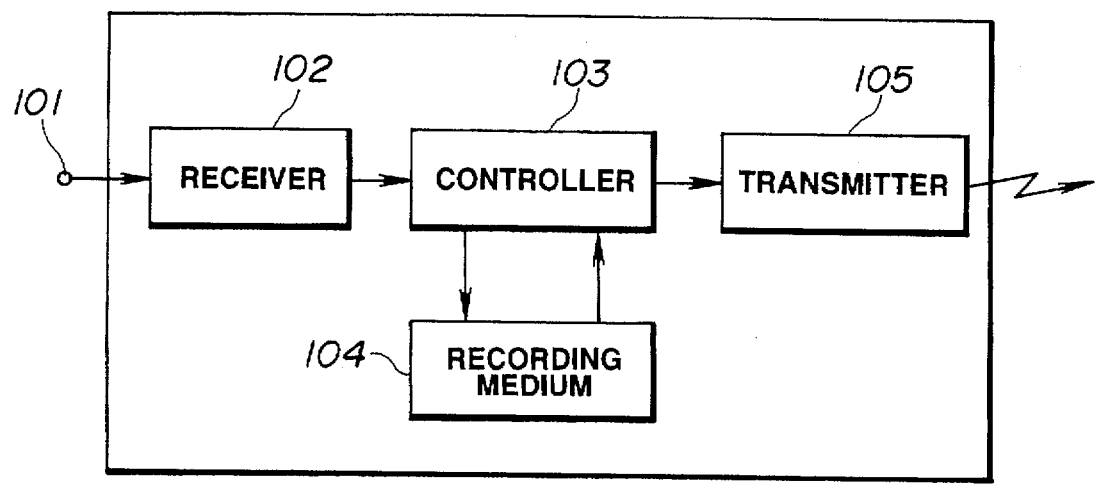
FIG. 8 is a schematic block diagram showing an arrangement of an information sending apparatus.

FIG. 8 shows an illustrative construction of the information sending unit 92 and the infrared sender 93 as examples of the information furnishing/collecting apparatus.

Referring to FIG. 8, a received signal via the antenna 91 shown in FIG. 7 is supplied to a terminal 101 of the information transmitting apparatus. The received signal is sent to a first receiver 102. If the received signal via the antenna 91 is an analog signal, the first receiver 102 converts it into a digital received signal. The output information from the first receiver 102 is temporarily recorded on a first recording medium 104 controlled as to recording and reproduction by a controller 103.

The information recorded on the first recording medium 104 is repeatedly reproduced in a sequence controlled by the controller 103 and sent to a transmitter 105. The transmitter 105 includes the above-mentioned infrared sender 93 and generates a driving signal driving the infrared transmitter 93 based upon the information supplied via the controller 103 for driving the infrared sender 93. Thus the infrared sender 93 of the transmitter 105 transmits an infrared signal derived from the information reproduced repeatedly from the first recording medium 104.

The contents of the first recording medium 104 may be suitably modified, that is re-written, based upon the information received by the receiver 102.

Figure 9:
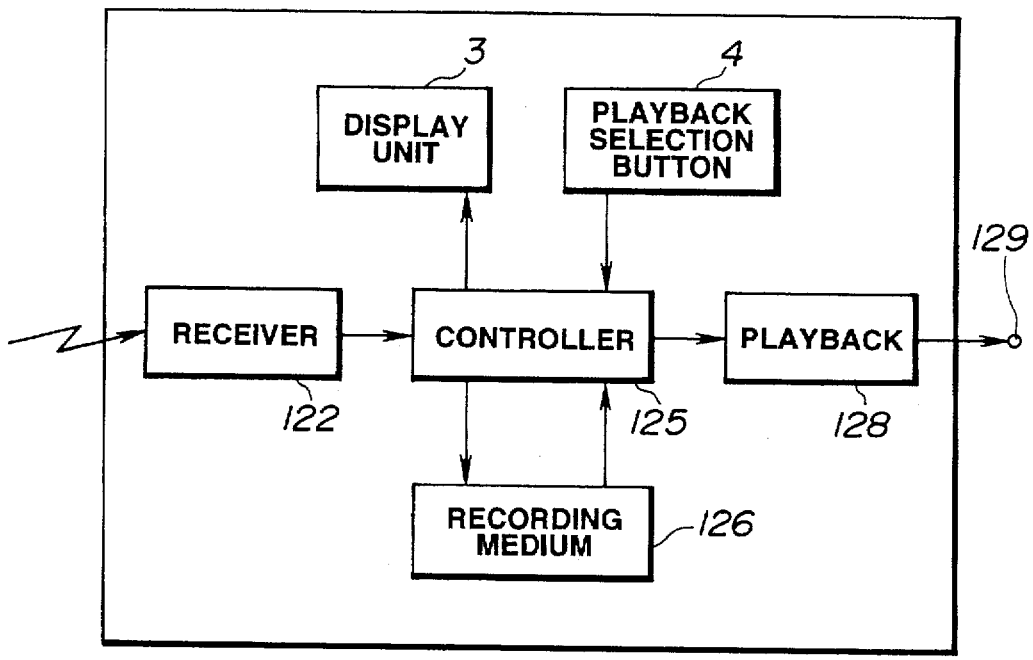
FIG. 9 is a schematic block diagram showing an arrangement of an information receiving/recording/reproducing apparatus.

Referring to FIG. 9, an illustrative arrangement of the information receiving/recording/reproducing apparatus, 60 of FIG. 5, owned by each recipient H, is explained.

Referring to FIG. 9, a second receiver 122 includes the infrared receiver 61 of FIG. 5, by which the second receiver receives infrared transmission signals sent from the infrared sender 93 of the information sending unit 92. Since a signal received and output by the infrared receiver 61 is an analog signal, the second receiver 122 converts the analog signal into digital information and outputs the resulting digital information to a controller 125. The output information from the second receiver 122 is temporarily recorded on a second recording medium 126 controlled as to recording and reproduction by the controller 125.

To the controller 125 are connected the display 3 and the playback selection buttons 4. The controller 125 displays the contents of the reproducible information recorded on the second recording medium 126 on the display 3. The recipient again presses a desired one of the playback selection buttons 4 based upon the contents displayed on the display 3 for issuing a command, such as a playback command. If the command for reproduction is issued by the recipient pressing the playback selection button 4, the controller 125 manages control for reproducing the commanded information from the second recording medium 126.

The recording and reproduction on or from the second recording medium 126 by the controller 125 may occur time-divisionally, so that recording and reproduction appear to proceed simultaneously. Such time-divisional processing may be achieved easily by allocating even-numbered accessing cycles and odd-numbered accessing cycles to the semiconductor memory used as the second recording medium 126 for recording (writing) and to reproduction (readout), respectively.

The information read out by the recording medium is distributed by the controller 125 to the display 3 or to a reproducing unit 128. That is, if the information from the second recording medium 126 is picture information, the controller 125 sends the picture information to the display 3 for display. If the information is speech information, the controller sends the information to the reproducing unit 128. The reproducing unit 128 converts the speech information to time-domain sample signals and further converts the time-domain sample signals to an analog speech waveform signal to be sent to the speech radiating portion, such as an earphone 5. This analog speech waveform signal is sent via a terminal 129 to the speech radiating portion.

If, in addition to the analog speech waveform signals, analog picture signals are output, the picture information is converted by a reproducing channel 128 into time-domain samples of picture signals, which are further converted into analog picture signals. In this case, a speech output terminal and a picture output terminal make up a terminal 129. From this picture output terminal, the picture signals are provided to an external display unit.

Figure 10:
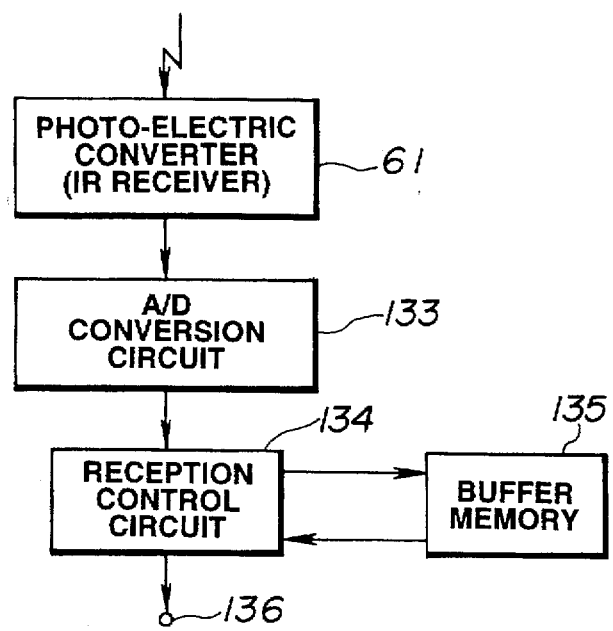
FIG. 10 is a schematic block diagram showing an arrangement of a receiving section of FIG. 9.

FIG. 10 shows an illustrative arrangement of a second receiver 122 of the information receiving/recording/reproducing apparatus shown in FIG. 9.

Referring to FIG. 10, the infrared receiver 61, such as the above-mentioned infrared receiver 61, receives the infrared light from the infrared sender 93 of the information sending unit 92, and converts the received infrared light by photoelectric conversion into analog reception signals, and further by an A/D conversion circuit 133 into digital information. The resulting digital information is then supplied via a reception control circuit 134 to the controller 125 of FIG. 9 to be recorded on the second recording medium 126 as described above. For synchronization with the time-divisional accessing time points to the reception control circuit 134, the digital information is transiently stored in a buffer memory 134 controlled as to writing and readout by the reception control circuit 134. The information read out from the buffer memory 135 under readout control of the reception control circuit 134 is provided via the reception control circuit 134 and a terminal 136 to the controller 125 of FIG. 9 so as to be recorded on the second recording medium 126 of FIG. 9. The function of the reception control circuit 134 may be included in the controller 125 of FIG. 9 in which case the reception control circuit 134 is eliminated.

Figure 11:
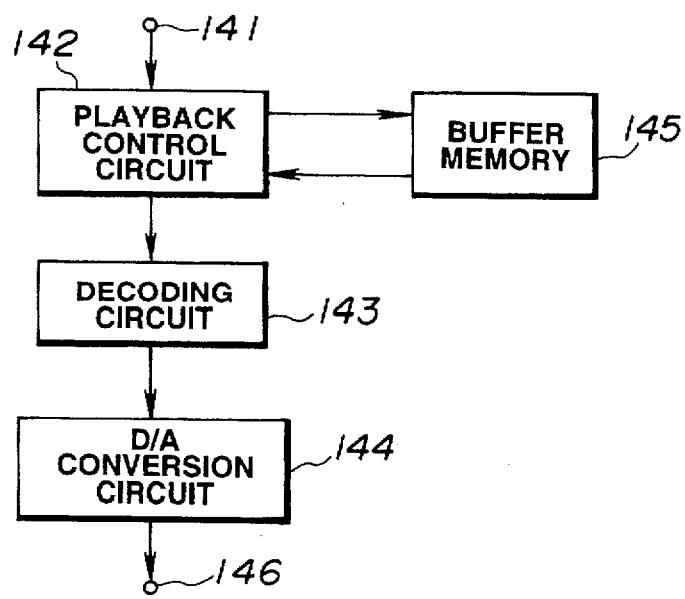
FIG. 11 is a schematic block diagram showing an arrangement of a reproducing section of FIG. 9.

FIG. 11 shows an illustrative construction of the reproducing unit 128 of the information receiving/recording/reproducing apparatus shown in FIG. 9. The following description is limited to processing speech signals for convenience.

Referring to FIG. 11, the information read out from the second recording medium 126 under control by the controller 125 of FIG. 9 is supplied to a terminal 141. This information is transiently stored in a buffer memory 145 controlled in writing/readout by a playback control circuit 142. The stored information in the buffer memory 145 is read out therefrom under control by the playback control circuit 142 at such a time as the information is needed by a downstream side decoding circuit 143. The decoding circuit 143 converts the information supplied from the buffer memory 145 into time-domain sample signals. The time-domain samples signals from the decoding circuit 143 are provided to a D/A converter 144 to be converted into analog waveform speech signals. These analog speech waveform signals are provided to the terminal 129 of FIG. 9 via a terminal 146. The function of the playback control circuit 142 may also be included in the controller 125 of FIG. 9 in which case the playback control circuit 142 is eliminated.

Figure 12:
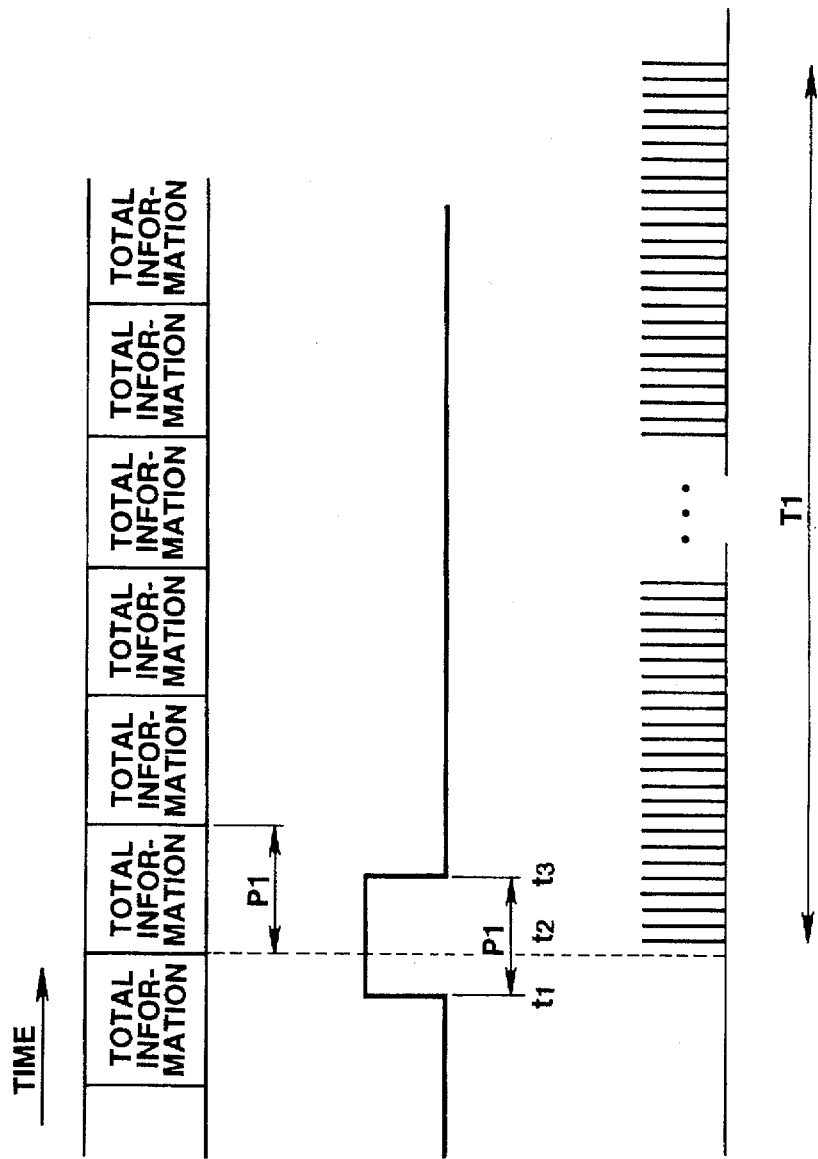
FIGS. 12A, 12B and 12C illustrate repetitive transmission of the total information.

Referring to FIG. 12, a typical timeline for the processing of information from transmission to reproduction according to the present invention is explained.

FIG. 12A shows the manner of repetitive transmission of the total information to be transmitted from the information sending unit shown in FIG. 8 (repetitive transmission of the total information data having the same contents). FIG. 12B shows the timing of receiving the information transmitted by the information receiving/recording/reproducing apparatus of FIG. 9 and writing the information on the second recording medium 126 of FIG. 9. That is, as shown in FIG. 12, the total information data to be transmitted is repetitively transmitted from the information sending unit of FIG. 8 within time P1 shorter than the reproducing time T1 of the total information data shown in FIG. 12C. The total information transmitted by the information sending unit is received by the information receiving/recording/reproducing apparatus and recorded on the second recording medium 126 of FIG. 9 at the timing shown in FIG. 12B.

If the recipient desirous to reproduce the information presses the playback selection button 4 of FIG. 9 at time t1 shown in FIG. 12 for commanding the reproduction, reception of the total information data and recording thereof on the recording medium 126 are started at this time t1. At time t2, the leading portion of the total information as from time t1 is recorded on the recording medium 126. At this time, that is, when the leading portion of the total information data has been recorded on the second recording medium 126, reproduction can be started from the leading portion of the total information recorded on the second recording medium 126 because the recording and reproduction on or from the recording medium occurs time-divisionally, as described above. Thus it is possible for the recipient to acquire the information from the leading end of the total information data. The start time t2 of reproduction from the second recording medium 126 can be easily detected by inserting a synchronization signal specifying the information data leading portion as a specified portion into the transmission information (the above-mentioned total information data to be transmitted, respectively). Since the information transfer to the information receiving/recording/reproducing apparatus then comes to a close at time t3, the recipient is free to be moved away from the range of reception, that is alight from the bus, in order to reproduce and enjoy the information subsequently. Although the recording on the second recording medium 126 may be started at time t2, it is more desirable to start the recording at time t1 in FIG. 13 for assuring earlier writing end time.

However, in the embodiment of FIG. 12, it is necessary to wait from the leading end to start reproduction for a time interval of time equal to P1 at the maximum. This is not entirely satisfactory in view of responsiveness to the command timing as set by the playback selection button for reproduction. An embodiment designed to overcome this drawback is now explained.

Figure 13:
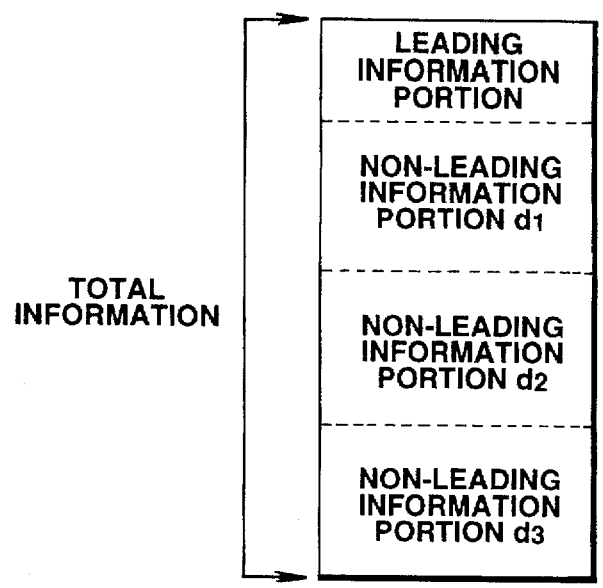
FIG. 13 shows the state of division of the repetitively transmitted total information.
Figure 14:
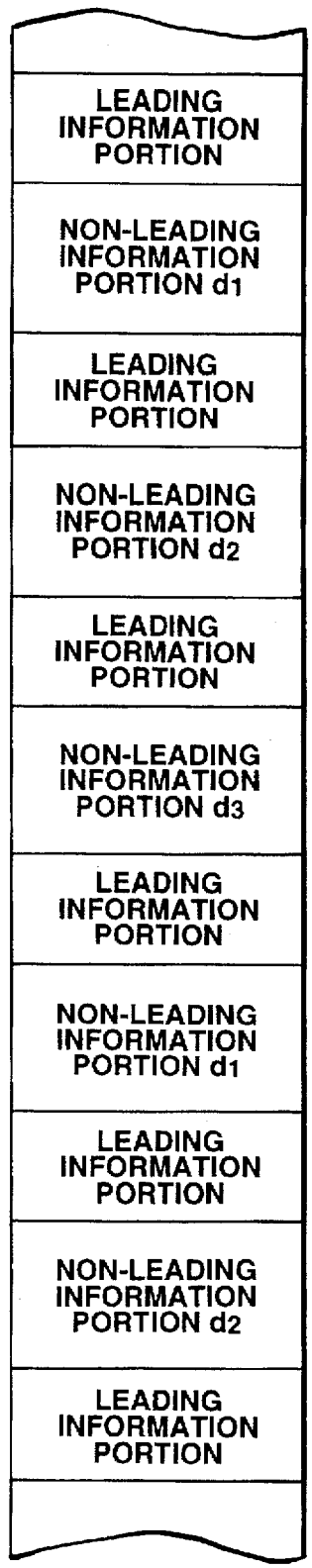
FIG. 14 illustrates the transmission information signals in the divided information portions are re-arranged.

FIG. 13 shows the manner in which the total information to be transmitted is divided into the leading information portion and non-leading information portions d1 to d3. FIG. 14 shows how the information divided as shown in FIG. 13 is re-arrayed for transmission as the transmission information signals. It is seen from FIG. 13 that the repetitively transmitted total information data of FIG. 12 consists of the leading information portion and the non-leading information portions d1 to d3. However, if the total information data is transmitted repeatedly, as shown in FIG. 12, the leading information portion is arrayed as a preceding portion intermediate between the non-leading information portions d1 to d3 as shown in FIG. 14 for increasing the frequency of repetition of the leading information portions than that of the non-leading information portions.

Figure 15:
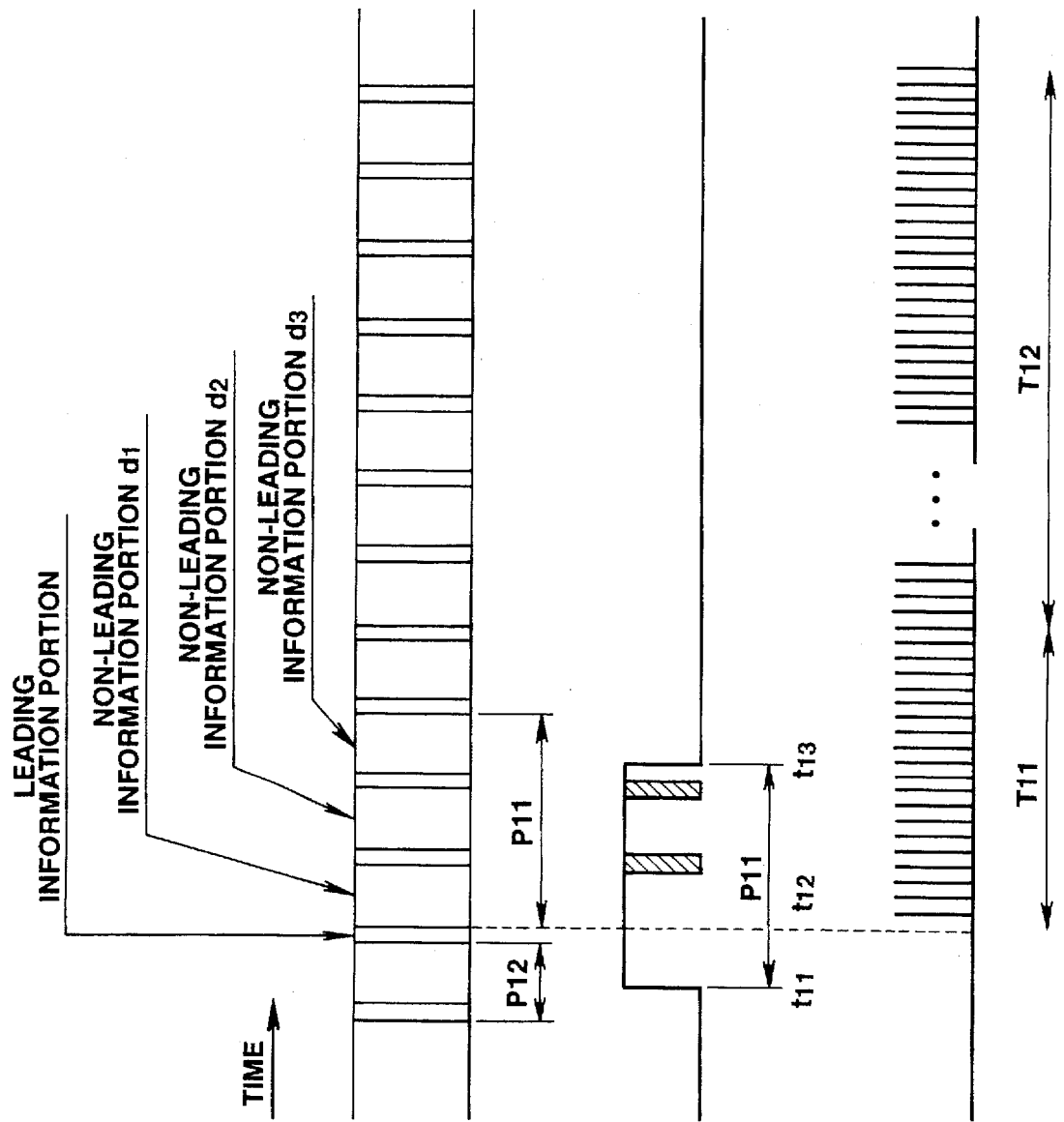
FIGS. 15A, 15B and 15C illustrates the repetitive transmission of the transmission information signals shown in FIGS. 13 and 14.

Referring to FIG. 15, a typical processing for reproducing the transmitted information in which the arraying sequence of the leading information portions and the non-leading information portions of the total information shown in FIG. 13 has been modified as shown in FIG. 14. FIG. 15A shows the manner of repetitive transmission of the total information, and FIG. 15B shows the timing of receiving the repetitively transmitted information by the information receiving/recording/reproducing apparatus and recording on the second recording medium 126 of FIG. 9.

That is, in the present processing, the total information data is transmitted at a time interval corresponding to the sum of the time P11 and the time corresponding to the transmission of a sole leading information portion, as shown in FIG. 15. The leading information portion is repeatedly transmitted with a shorter time P12. The information receiving/recording/reproducing apparatus receives the repeatedly transmitted information at a timing indicated in FIG. 15B for recording on the recording medium 126 of FIG. 9.

Thus, if the recipient desirous to reproduce the information presses the playback selection button 4 of FIG. 9 at a time t11 of FIG. 15 for issuing a command for reproduction, information reception and information recording on the second recording medium 126 of FIG. 9 is started as from the time t11. Then, at time t12, the leading information portion of the total information data as from the time t11 is recorded on the second recording medium 126. At this time, that is when the leading portion of the total information has been recorded on the second recording medium 126, reproduction can be started from the leading portion of the information, because the recording and reproduction on or from the recording medium occurs time-divisionally, as described above. Thus the subscriber is able to obtain information from the leading portion of the information. Since the information transfer to the information receiving/recording/reproducing apparatus comes to a close at time t13, the recipient is free to be moved away from the range of reception, e.g., away from the bus, at time t13, and may reproduce and enjoy the information subsequently. The hatched portions in FIG. 15B correspond to the repeatedly occurring leading information portions. These portions need not be newly recorded since these portions have already been recorded on the second recording medium 126 of FIG. 9.

In FIG. 15C, T11 represents the playback time for the leading information portion. This playback time T11 is set so as to be longer tan the time P11. Thus, at a time point when the reproduction of the leading information has come to a close, the totality of the information has been recorded on the second recording medium 126 of FIG. 9. Consequently, reproduction can be continued without interruptions. The playback time T11 can be easily set so as to be longer than the time P11 especially if the bit rate for information transmission is significantly higher than the bit rate for reproduction. If, in the embodiment of FIG. 13, transmission is to be performed as in the embodiment of FIG. 14, with the playback time for the leading information portion being 6 minutes, the playback time for each of the non-leading information portions d1 to d3 being 18 minutes and the information transmission bit rate being 60 times as high as the information playback bit rate, it is necessary to receive the information corresponding to the playback time of 72 minutes. This is completed within 1 or 2 minutes such that recording of the total information on the second recording medium 126 is terminated within the playback time of the leading information portion. Meanwhile, T12 specifies the playback time for the non-leading information portions.

The information transmission method, as described above by referring to FIGS. 13 to 15, has a significant merit that the playback time P12 shorter than the time of transmission of the total information becomes equal to the maximum waiting time as from the leading end until the start of reproduction. This improves response characteristics to the command timing by the playback selection button 4 for reproduction.

In the above-described embodiment, the leading portion of the information data is transmitted repeatedly. However, plural information data may be transmitted, while the repeatedly transmitted information may include the guide information for these information items.

Figure 16:
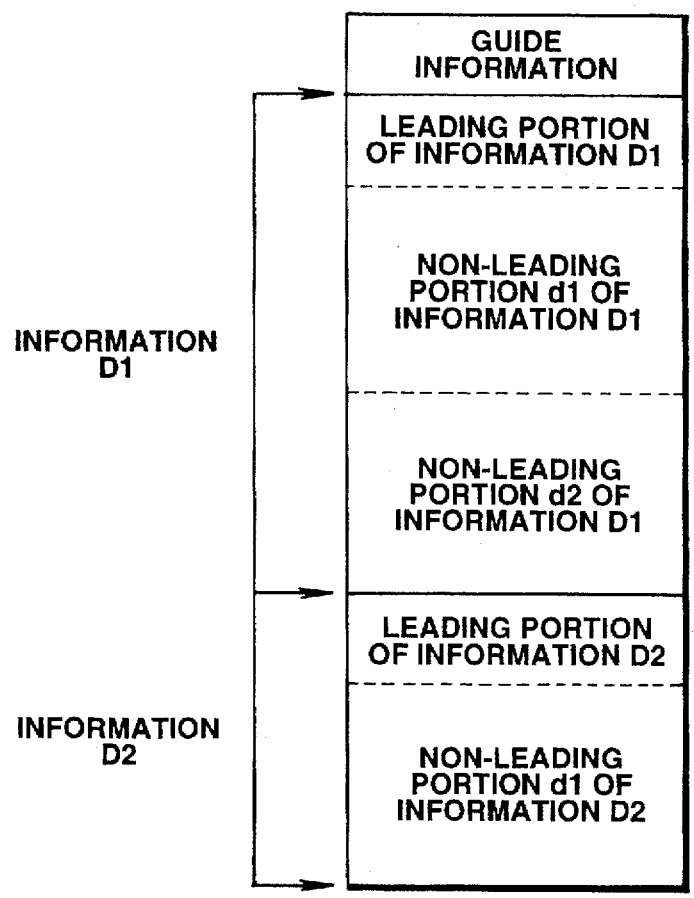
FIG. 16 illustrates the manner of division of the repetitively transmitted information items in case there are plural such information items.
Figure 17:
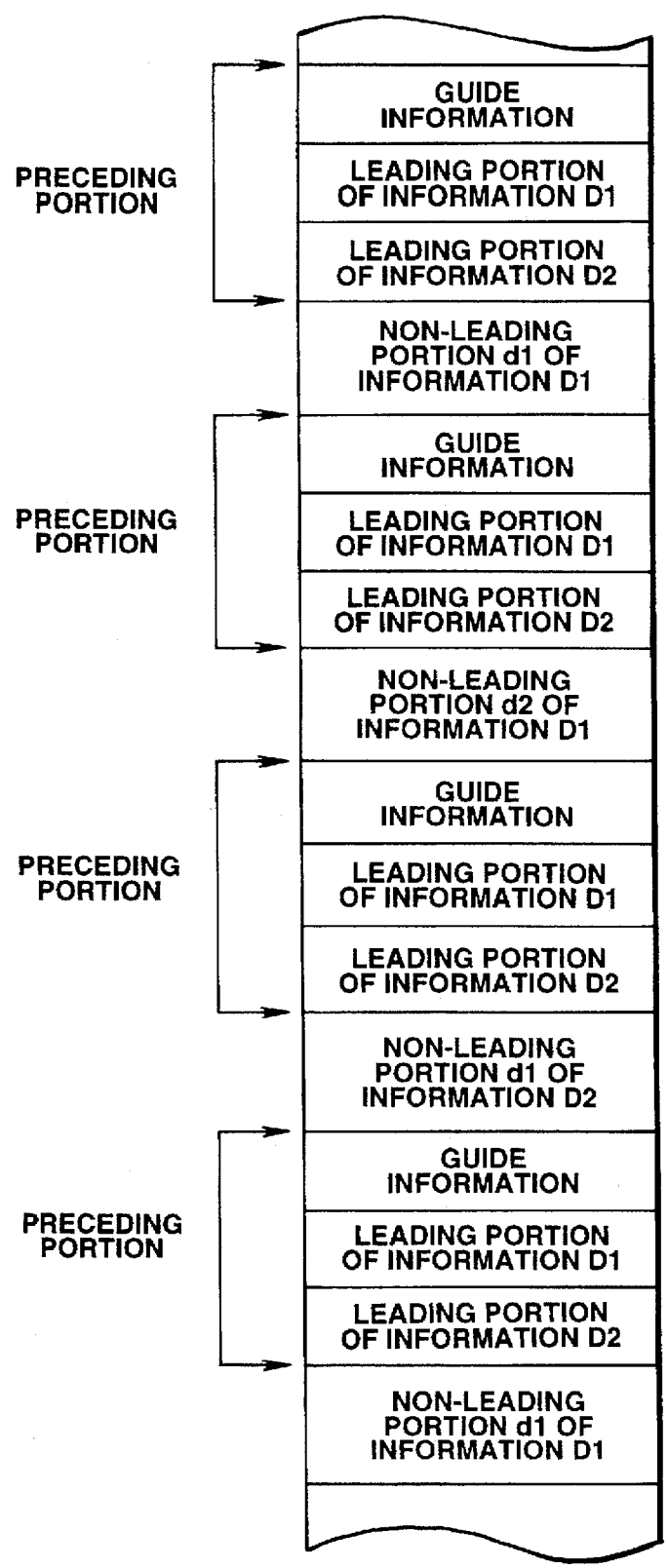
FIG. 17 illustrates the transmitted information signals in which the plural information items divided as shown in FIG. 16 are re-arrayed.

If there are plural such transmission information data and the repeatedly transmitted information contains the guide information for these information data, repetitive transmission may be performed as shown for example in FIGS. 16 and 17.

Similarly to FIGS. 13 and 14, FIGS. 16 and 17 show the contents of data stored in the first recording medium 104 of FIG. 8 and the transmission sequence of the information of FIG. 13, respectively. That is, if the information to be transmitted is comprised of an information data D1 and an information data D2, as shown in FIG. 16, the information to be transmitted is divided into the guide information, a leading portion of the information data D1, a non-leading portion of the information data D1, such as two non-leading information portions d1 and d2, a leading portion of the information data D2, and a non-leading portion of the information D2, such as a non-leading portion d1 of the information data D2, as shown in FIG. 16. In such case, the guide information, the leading portion of the information data D1 and the leading portion of the information data D2 represent specified portions. As for the information to be transmitted, shown in FIG. 16, preceding portions, each consisting of the guide information, a leading portion of the information D1 and a leading portion of the information D2, are arrayed between the non-leading portions d1 and d2 of the information D1 and the non-leading portion d1 of the information D2, so that the preceding portions appear more frequently than the non-leading portions d1 and d2 of the information D1 and the non-leading portion d1 of the information D2.

In these embodiments, shown in FIGS. 16 and 17, reproduction of the information selected by the playback selection button 4 may be started after a short waiting time by the processing similar to that shown in FIG. 15 and continued without interruptions. Although the guide information, and the leading portions of the information data D1 and D2 are transmitted with the same frequency of occurrences, the guide information, for example, may be transmitted with a higher repetition frequency.

Figure 18:
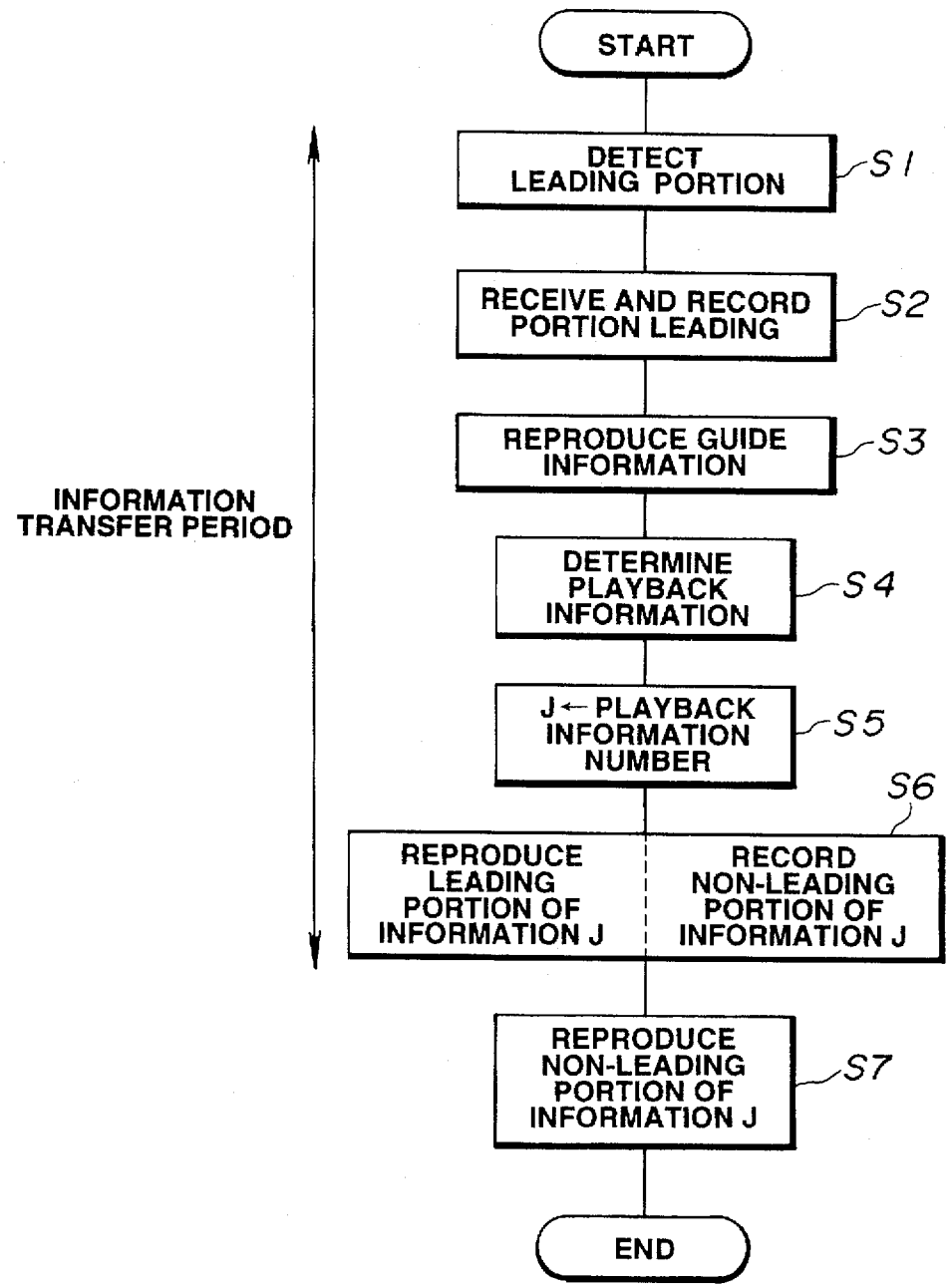
FIG. 18 is a flowchart showing the processing flow in a controller of FIG. 9 in case of effective utilization of the recording medium.

In addition, with the present embodiment, only the information selected by the playback selection button 4 may be recorded on the second recording medium 126 of the information receiving/recording/reproducing apparatus of FIG. 9 for effective utilization of the second recording medium 126. In FIG. 18, the control flow in the controller 125 in such case ins shown.

In FIG. 18, a preceding portion is detected at step S1 and, after detecting the preceding portion, the information is recorded at the next step S2 on the second recording medium 126 as the preceding portion is received. At step S3, the guide information is reproduced. At step S4, the playback information is determined in accordance with the command as set by the recipient pressing the playback selection button 4. At step S5, the playback information number is set to J. At the next step S6, the leading portion of the information corresponding to the playback information number J is reproduced, and only the non-leading portion of the information data corresponding to the playback information data is recorded on the recording medium 126. At step S7, the non-leading portion of the information corresponding to the playback information number J recorded on the recording medium 126 is reproduced.

Although the foregoing description has been made with reference to radio broadcasting the information using infrared rays, the present invention may be applied to radio broadcasting in general, cable broadcasting or to information transmission by the method illustrated in FIGS. 1 to 4. However, the above-described technique by the radio transmission is highly effective when it is desired to transmit the information to a number of portable information receiving/recording/reproducing apparatus. Infrared rays may be employed most effectively for transmitting the information in only specified sites without extensively affecting electromagnetic waves. Although there is no limitation as to information types, the present invention may be applied most effectively to speech signals which may safely be reproduced by a portable information receiving/recording/reproducing apparatus. Although the foregoing embodiment is directed transmission of the information at a rate higher than the playback rate by digitizing the signals and transmitting the resulting digital signal at a high bit rate, the transmission signals may also be analog signals instead of digital signals. That is, analog signals may also be transmitted and D/A converted by the information receiving/recording/reproducing apparatus for recording on the recording medium. However, diverse information data may be transmitted in a unified manner by transmitting digitized signals as in the above-described embodiments.

According to the present invention, described above, the transmission side transmits the information repeatedly at a rate higher than the information reproducing rate at the receiving side, which then receives the repeatedly transmitted information at a rate higher than the information reproducing rate and records the reception information from the repeatedly transmitted and received information data. Thus it becomes possible to transmit the information, such as speech or pictures, to a number of recipients, without these recipients having to wait for prolonged time. In addition, the recipient, if moved, is able to receive the high-quality speech or pictures repeatedly whenever desired.

While the present invention has been described with reference to specified embodiments disclosed herein, it is to be noted that the application is intended to cover many modification which may be comprised within the purport of the invention as set forth in the following claims.

What is claimed is:

1. A method for transmitting information to an information receiving/reproducing apparatus, comprising the steps of:

storing the information on a recording medium;
repeatedly reading out the information stored in said recording medium at a read-out rate higher than a reproduction rate of the information receiving/reproducing apparatus; and
repeatedly transmitting the repeatedly read-out information at a transmission rate higher than the reproduction rate of the information receiving/reproducing apparatus.

2. The method as claimed in claim 1, wherein in said read-out step, a specified portion of the information is read out at a repetition frequency higher than that for remaining portions.

3. The method as claimed in claim 2, wherein said specified portion includes a leading portion.

4. The method as claimed in claim 2, wherein said information includes plural information portions and wherein said specified portion includes a leading portion.

5. The method as claimed in claim 4, wherein said specified portion includes guide information for the plural information portions.

6. The method as claimed in claim 2, wherein in said transmission step, the information is transmitted during a playback time for the specified portion.

7. An apparatus for transmitting information to an information receiving/reproducing apparatus, comprising:

a recording medium in which the information is stored;

control means for storing the information on the recording medium and for repeatedly reading out the information stored in said recording medium at a read-out rate higher than a reproduction rate of the information receiving/reproducing apparatus; and means for repeatedly transmitting the repeatedly read-out information at a transmission rate higher than the reproduction rate of the information receiving/reproducing apparatus.

8. The apparatus as claimed in claim 7, wherein said control means causes a specified portion of the information to be read out at a repetition frequency higher than that for remaining portions.

9. The apparatus as claimed in claim 8, wherein said specified portion includes a leading portion.

10. The apparatus as claimed in claim 8, wherein said information includes plural information portions and wherein said specified portion includes a leading portion.

11. The apparatus as claimed in claim 10, wherein said specified portion includes guide information for the plural information portions.

12. The apparatus as claimed in claim 8, wherein said transmission means transmits the information within a playback time for the information of the specified portion.

* * * * *